United States Patent [19]

Moskalik et al.

[11] 4,438,393
[45] Mar. 20, 1984

[54] PHASE-METERING DEVICE

[76] Inventors: Leonid M. Moskalik, ulitsa Molodezhnaya, 13, kv. 177; Vladimir E. Ryadchikov, ulitsa Gagarina, 28, kv. 59; Anatoly P. Bykov, ulitsa Stroitelnaya, 6, kv. 16; Vladimir P. Kulesh, ulitsa Stroitelnaya, 6, kv. 29; Stanislav I. Opasov, ulitsa Chkalova, 11, kv. 11; Anatoly A. Orlov, Naberezhnaya Tsiolkovskogo, 22, kv. 82, all of Zhukovsky, Moskovskoi oblasti, U.S.S.R.

[21] Appl. No.: 294,026
[22] Filed: Aug. 18, 1981
[51] Int. Cl.³ ............................................. G01R 25/00
[52] U.S. Cl. ................................... 324/83 D; 328/133
[58] Field of Search ........... 328/133; 324/83 R, 83 D, 324/140 R

[56] References Cited

U.S. PATENT DOCUMENTS

| | | | |
|---|---|---|---|
| 3,820,022 | 6/1974 | Watt | 324/83 D |
| 3,989,931 | 11/1976 | Phillips | 324/83 D |
| 4,070,618 | 1/1978 | Thomas | 324/83 D |
| 4,144,489 | 3/1979 | Ward | 324/83 D |

FOREIGN PATENTS DOCUMENTS 2,721,136  5/1977  Fed. Rep. of Germany
1,363,968  3/1972  United Kingdom.

Primary Examiner—Michael J. Tokar
Attorney, Agent, or Firm—Holman & Stern

[57] ABSTRACT

A phase-metering device comprises first and second input signal sources; N−1 phase-shift circuits at N exceeding two, which are placed in series, a phase shift of each of said circuits being equal to $\pi/N$ radians, the input of the first phase-shifter circuit being connected to the second input signal source; N phase converter units each having two potential (positive and inverted) outputs and two pulse outputs, first inputs of said units being connected to the first input signal source, a second input of the first phase converter unit being connected to the first input signal source, while second inputs of the other phase converter units are coupled to the outputs of the respective phase-shift circuits; the outputs of said phase converter units being connected to inputs of a pulse distributor whose outputs are coupled to inputs of a reversible counter; a digital recorder being connected to the outputs of said reversible counter.

4 Claims, 10 Drawing Figures

PHASE-METERING DEVICE

FIELD OF THE INVENTION

The present invention relates to measuring equipment and, in particular, to phase-metering devices designed to measure the phase between two electrical signals by counting cycles with suitable reversible counting means.

INDUSTRIAL APPLICABILITY

The invention may be used in laser interferometers for measuring movements and vibrations and, also, in other measuring devices wherein a measured physical quantity is converted into a phase shift.

PRIOR ART

Laser interference measuring methods based on optical heterodyning are widely used at the present time. With such methods, information on a measured physical quantity is, at the final stage, converted into a corresponding change of a phase shift between two electrical signals.

While the physical quantity is varied, the phase shift may vary over one period ($2\pi$ radians) and also within wider limits exceeding by many times said period. Fairly high rates of change of the phase shift result in the appearance of Doppler frequencies as high as hundreds or even thousands of kilocycle. It is conventional practice to utilize phase-metering devices with reversible counting of cycles for measuring said phase shifts.

In the afore-mentioned devices stringent requirements are placed upon a cycle counting speed, reversal speed, resolution and reliability, all of which should be fairly high.

Known in the art is a phase-metering device comprising a phase-shift circuit, two phase-analog converters and a ratiometer. The first inputs of the phase-analog converters are connected to a first input signal source, while the second input of the first phase-analog converter is coupled to a second input signal source and through the phase-shift circuit to the second input of the second phase-analog converter. The outputs of the phase-analog converters are connected to the inputs of the ratiometer (cf O. V. Belavin "Fundamentals of Radionavigation", Moscow, "Soviet Radio", 1977, p. 203, in Russian).

However, the foregoing device is unfit for measuring a phase shift exceeding $\pi$ radians inasmuch as the indications of the ratiometer and of the entire device are unambigous only within a range of ± radians. (The ratiometer measures the ratio of two voltages: $A_o \sin \phi$ and $A_o \cos \phi$).

Another known phase-metering device comprises a phase-shift circuit and two phase-analog converters in the optical frequency range, Schmitt triggers, a count pulse shaper, and a reversible counter.

The phase-shift circuit and the two phase-analog converters are part of a two-channel homodyne interferometer wherein a desired phase shift is obtained by adjusting the position of one of the mirrors on which the light beam path depends. Phase-analog conversion occurs in light detectors, say in photomultiplier tubes, wherein the energy and phase of the beams is, respectively, converted into the energy and value of current. As the light beam path changes, the output currents of the detectors vary in a periodic manner being shifted with respect to one another by $\pi/2$ radians. The outputs of the phase-analog converters are connected through the Scmitt triggers to the inputs of the count pulse shapers whose outputs are coupled to the reversible counter (cf. D. I. Zorin et al. "Line Standard Measurements by the Interference Band Method", Proceeding of Mendelyav AVSRE 78(138), "Standards" publishing house, Moscow-Leningrad, 1965, in Russian).

However, the afore-mentioned device has been generally unsatisfactory due to inadequate count-down resolution (as low as one interference band, i.e. $2\pi$ radians), low count and reversal speeds (1300 pulses per second), disadvantages associated with limitation of the frequency of the output signal of the phase-analog converters peculiar to homodyne metering circuits and also with configuration and structural defects of the count pulse shapers and the reversible counter.

Furthermore, the foregoing device has low reliability due to the fact that the pulse shapers include d-c devices characterized by such undesirable features as a zero drift and noise, a limitation inevitable with the homodyne measuring method. The known device involves the method of enhancing resolution by measuring a fractional part of the bands on a CRT screen. Apparently, such a method cannot be automatic. Furthermore, the problem of reversible counting of cycles has not been fundamentally solved.

Another known phase-metering device comprises a phase-shift circuit and two phase converter units in the optical frequency range. Each phase converter unit includes a phase-analog converter representing a photodetector mounted in a Michelson interferometer using a homodyne circuit, an amplifier, a Schmitt trigger, and two pulse shapers. A quarter-wave plate acting as a phase-shift circuit is placed in the way of one of the interference beams entering one of the photodetectors. The positive and inverted outputs of the Schmitt trigger serve as potential outputs of the phase converter unit, while the outputs of the shapers act as pulse outputs.

The known device also includes a pulse distributor, the inputs of which are connected to the outputs of the phase converter units, while its outputs are coupled to the reversible counter connected to a digital recorder (cf. V. P. Koronkevitch et al "Laser Interferometer for Length Measurements"; V. P. Kiryanov et al "Electronic Count and Recording Device for Laser Movement Meter", "Avtometriya", No. 1, 1974, Novosibirsk, SB of the Academy of Sciences of the USSR, in Russian).

The afore-mentioned device also comprises a time-delay circuit introducing correction into the reversible counter and placed between the outputs of a sign flip-flop indicating the sign of the measured quantity and the set inputs of the reversible counter (reset and set inputs of the T flip-flops of the reversible counter).

Disadvantages of the aforesaid phase-metering device are inadequate resolution (as low as $\pi/2$ radians), a limited reversal speed as compared with a possible count speed, and low reliability. The above disadvantages are attributed to the fact that, on completion of the zero state, the reversible counter is switched over from the subtract to add mode at the moment a first adding pulse appears. At this moment the indication of the counter is incorrect and a correction will be introduced thereto after a certain time. The time required to introduce the correction limits the permissible recurrence rate of the count pulses, which is four times the Doppler frequency with the resolution equalling $\pi/2$. The reliability of the known phase-metering device is low due to high probability of failures in operation of the reversible counter, a factor particularly noticeable at a high rate of change of a phase-shift between the input signals and the corresponding Doppler frequency.

DISCLOSURE OF THE INVENTION

It is an object of the present invention to increase resolution of a phase-metering device.

Another object of the invention is to increase reversal speed of a phase-metering device.

One more object of the invention is to enhance operational reliability of a phase-metering device featuring high resolution.

The foregoing objects are accomplished by that a device comprising two phase converter units each having two potential (positive and inverted) outputs and two pulse outputs, first inputs of which are connected to a first input signal source, a second input of the first phase converter unit being connected to a second input source and through a phase-shift circuit to a second input of the second phase converter unit, a pulse distributor, the inputs of which are coupled to the outputs of the phase converter units and whose outputs are connected to a reversible counter coupled to a digital recorder, according to the invention, additionally includes $N-2$ phase converter units with N exceeding two, first inputs of said additional phase converter units being connected to the first input signal source, while a second input of each subsequent phase converter unit is coupled to a second input of each preceeding phase converter unit through the phase-shift circuit, a phase-shift of each of $N-1$ phase-shift circuits being equal to $\pi/N$ radians.

The phase-metering device forming the subject of the present invention features enhanced resolution, i.e. it provides a decrease in discreteness of a phase-shift measurement to $\pi/N$ radians ($N>2$). When the hereinproposed phase-metering device is used with a laser movement meter employing a Michelson interferometer, such an increase permits measuring movements with the resolution equalling 1/2N of a laser radiation wavelength.

With a reversible counter representing negative numbers in sign-and-magnitude form, the hereinproposed phase-metering device preferably includes a sign recorder inserted between the pulse distributor and the reversible counter and provided with a null indicator. Advantageously the sign recorder includes a sign flip-flop, two NAND gates, two two-input AND-OR gates and four AND gates whose first inputs are connected to the outputs of the pulse distributor, the outputs of the first two AND gates being coupled to the inputs of the sign flip-flop whose outputs are connected to the first inputs of the NAND gates and to the inputs of the two-input AND-OR gates which are connected in pairs, the outputs of the NAND gates being connected to the second inputs of the two second AND gates whose outputs are connected to the other inputs of the two-input AND-NOT gates connected in pairs, while the outputs of the two-input AND-OR gates are coupled to the inputs of the reversible counter, the second inputs of the NAND gates and the first two AND gates being connected to the output of the null indicator.

This is done by increasing a reversal speed so that it equals a unidirectional count speed, a feature particularly important considering high resolution of the phase-metering device wherein the recurrence rate of count pulses is appreciably increased and a low reversal speed limits its response.

Desirably the phase-meterin device comprises a code converter placed between the potential outputs of the phase converter units and the lower-order digit inputs of the digital recorder, and the pulse distributor includes two AND gates having first inputs connected to the pulse outputs of the last phase converter unit, second inputs interconnected and coupled to one of the potential outputs of one of the preceding phase converter units, while the outputs thereof act as the outputs of the pulse distributor.

This substantially enhances operational reliability of the phase-metering device since the recurrence rate of count pulses coming to the input of the reversible counter is always equal to the Doppler frequency regardless of the resolution.

At $N=4$ in the case of a binary count and recording system it is of advantage that the code converter should incorporate three exclusive OR gates, the inputs of the first gate being connected to the positive potential outputs of the second and fourth phase converter units, the inputs of the second exclusive OR gate being coupled to the positive potential outputs of the first and third phase converter units, while the inputs of the third exclusive OR gate are connected to the outputs of the first two exclusive OR gates, the positive potential output of the fourth phase converter unit and the outputs of the first and third exclusive OR gates being coupled to the lower-order digit inputs of the digital recorder.

BRIEF DESCRIPTION OF DRAWINGS

The invention will now be described further with reference to specific embodiments thereof, taken in conjunction with the accompanying drawings, wherein.

PREFERRED EMBODIMENTS OF THE INVENTION

Figure 1:
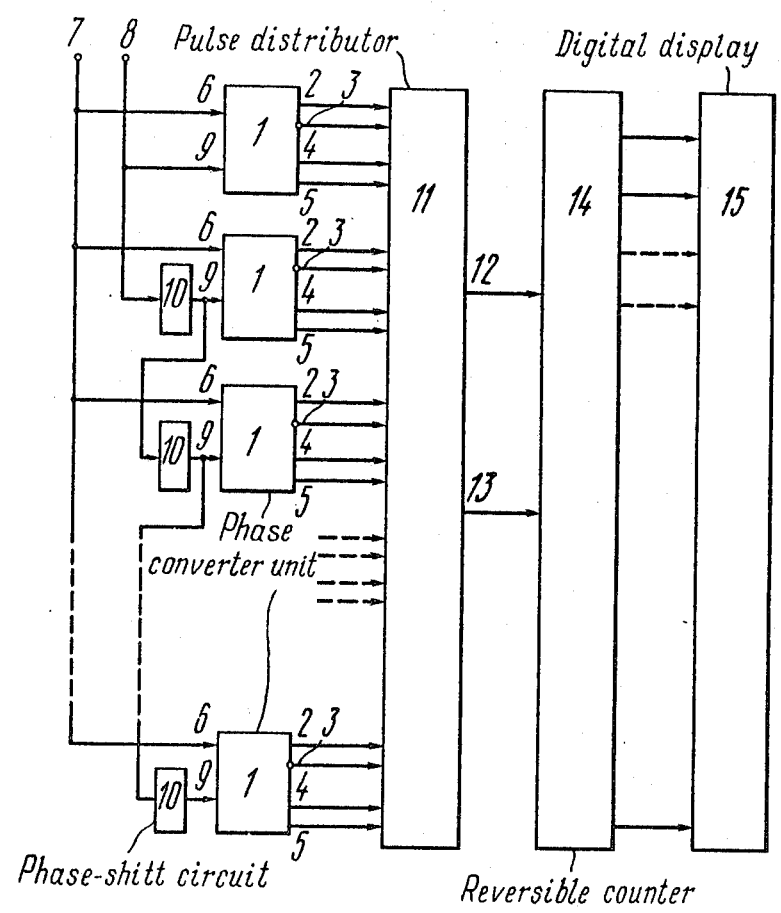
FIG. 1 is a block diagram of a phase-metering device according to the invention.

Referring to the drawings the phase-metering device (FIG. 1) forming the subject of the present invention comprises phase converter units 1, each of which has two potential outputs (positive output 2 and inverted output 3) and two pulse outputs 4 and 5. Depending on desired resolution in phase measurements ($\pi/N$ radians), there may be chosen a suitable number of the phase converter units 1. This number (N) should not be less than two. First inputs 6 of all the phase converter units 1 are connected to a first input signal source 7, while a second input signal source 8 is coupled to a second input 9 of the first phase converter unit 1. The second input 9 of each subsequent phase converter unit 1 is coupled to the second input 9 of each preceding phase converter unit 1 through a phase-shift circuit 10 whose number is $N-1$. A phase-shift of each of the phase-shift circuits 10 is $\pi/N$ radians. The outputs 2, 3, 4 and 5 of the phase converter units 1 are connected to the inputs of a pulse distributor 11, while outputs 12 and 13 thereof are coupled to the inputs of a reversible counter 14 connected to a digital recorder 15.

Figure 2:
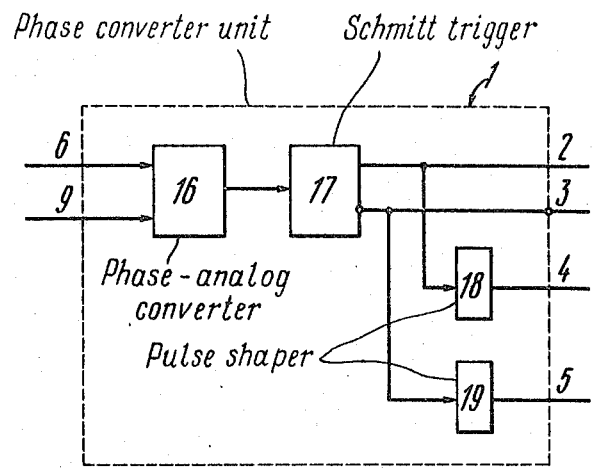
FIG. 2 shows an embodiment of a phase converter unit according to the invention.

Each phase converter unit 1 (FIG. 2) includes a phase-analog converter 16 coupled to a Schmitt trigger 17 whose positive and inverted outputs act as the potential outputs 2 and 3 of the phase converter unit 1. The outputs 2 and 3 are also connected to the two pulse shapers 18 and 19 whose outputs serve as the pulse outputs 4 and 5 of the phase converter unit 1. The inputs of the phase-analog converter 16 act as the inputs 6 and 9 of the phase converter unit 1.

Figure 3:
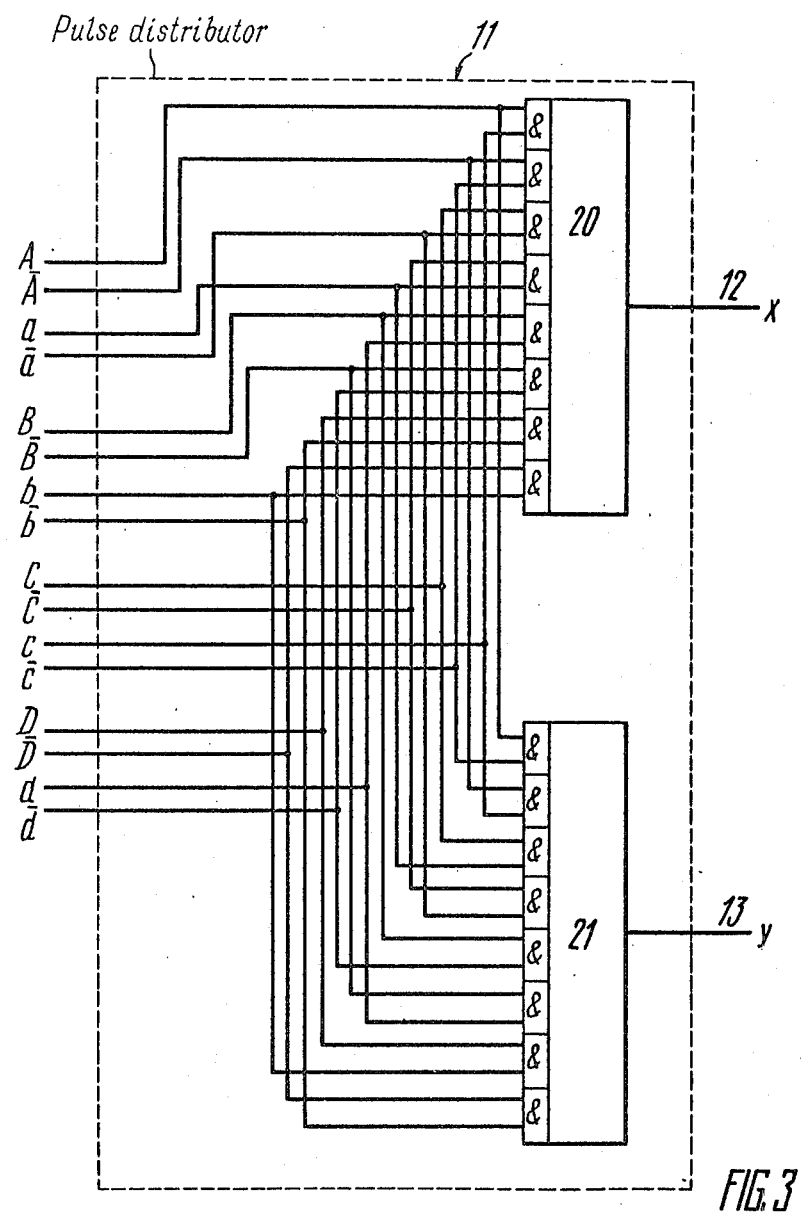
FIG. 3 depicts an embodiment of a pulse distributor at $N=4$ according to the invention.

The pulse distributor 11 (FIG. 1) distributes between its two outputs 12 and 13 count pulses appearing at the pulse outputs 4 and 5 of the phase converter unit 1. Pulses will appear at the output 12 or 13 of the pulse distributor 11 depending on the direction of cariation of the phase between the input signals. In the case of count discreteness of $\pi/N$ with four phase converter units 1 (N=4), the pulse distributor 11 (FIG. 3) may, for example, include two eight-input AND-OR gates 20 and 21 whose inputs are connected in pairs and coupled to the outputs of the phase converter unit 1, while the outputs thereof act as the outputs 12 and 13 of the pulse distributor 11.

Figure 4:
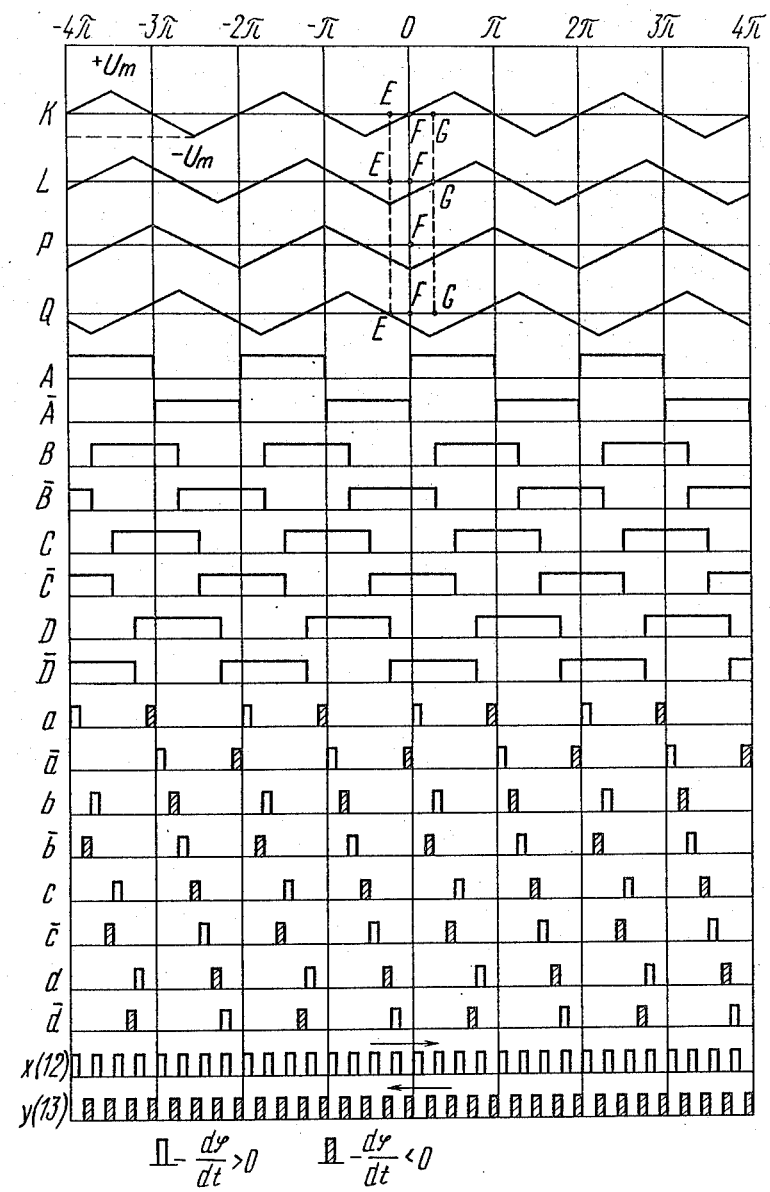
FIG. 4 illustrates output voltage waveforms of the circuit components of FIGS. 1, 2 and 3 as a function of phase according to the invention.

Consider now operation of the phase-metering device comprising four phase converter units (N=4). Continuous-wave harmonic signals are fed from the input signal sources 7 and 8 to the inputs 6 and 9 of the phase converter unit (FIG. 1). Due to the action of the phase-shifter circuits 10 the second input 9 of each subsequent phase converter unit 1 accepts the signal shifted by $\pi/4$ radians with respect to the signal at the input 9 of each preceding phase converter unit 1. In each phase converter unit 1 (FIG. 2) said signals arrive at the two inputs of the phase-analog converter 16 whose output voltage is dependent upon a phase-shift between the input signals. More specifically, the phase-analog converter 16 may be desighed so that the illustrated relationship (FIG. 4) is as follows: the output voltage will increase from a certain negative value $-U_m$ to a positive value $+U_m$ as the phase-shift between the input signals varies from $\pi/2$ to $\pi/2$ radians and decrease from the positive value $+U_m$ to the negative value $-U_m$ as the phase-shift varies from $\pi/2$ to $\pi/2$ radians (FIG. 4 K, L, P, Q). The output voltage of the phase-analog converter 16 (FIG. 2) will be zero twice during the period, i.e. when the phase-shift between the input signals equals zero and $\pi$ radians. If the output voltage of the phase-analog converter 16 is linearly dependent on the phase-shift between the input signals in each of the aforesaid range, the output voltage waveforms of the phase-analog converters 16 of all the four phase converter units 1 will be represented by sawtooth curves (FIG. 4) denoted by K, L, P, and Q. Due to the phase-shift circuits inserted between the second inputs 9 (FIG. 1) of the adjacent phase converter units 1, the sawtooth voltage curve L (FIG. 4) of the phase-analog converter 16 (FIG. 2) of the second phase converter unit 1 is shifted by $\pi/4$ radians with respect to the similar curve K (FIG. 4) of the first phase converter unit 1. Likewise the sawtooth voltage curve P of the third phase converter unit 1 is shifted by $\pi/4$ radians relative to the curve L of the second phase converter unit 1, etc. The Schmitt triggers (FIG. 2) convert the above voltages into square-wave voltages, and short-duration pulses are generated by the shapers 18 and 19 using the edges of the output square voltage pulses furnished by the Schmitt triggers 17. Said shapers employ, for example, a driven multivibrator circuit.

The pulse distributor 11 (FIG. 3) accepts square-wave voltages from the positive and inverted outputs of the Schmitt triggers 17 (from the potential outputs 2 and 3 of the phase converter unit 1) and output pulses of the shapers 18 and 19 (from the pulse outputs 4 and 5 of the phase converter units 1).

Owing to the fact that the rate of phase-shift between the sawtooth curves representing the output voltages of the phase-analog converters 16 (FIG. 2) is $\pi/4$ radians, the output pulses of the shapers 18 and 19 of all the phase converter units 1 will be spaced accordingly. Said pulses are combined at the outputs 12 or 13 of the pulse distributor 11 (FIG. 1) and fed to the reversible counter 14 every $\pi/4$ radians as the phase between the input signals changes. This increases resolution of the phase-metering device to $\pi/4$ radians (to $\pi/N$ radians in the general case), as compared to $\pi/2$ radians in the prior art devices.

The pulse distributor 11 (FIG. 3) performs the function of combining count pulses at the two outputs 12 or 13, depending on the direction of phase variation (increase or decrease). In the distributor count pulses appear at the output of the eight-input AND-OR gate 20 (at the output 12 of the pulse distributor 11) if the phase-shift is increased ($d\phi/dt > 0$, where $\phi$ is the phase-shift and t is time). If the phase-shift decreases ($d\phi/dt < 0$), the count pulses will appear at the output of the eight-input AND-OR gate 21 (at the output 13 of the pulse distributor 11). In FIG. 4 short count pulses appearing during a positive change of the phase-shift ($d\phi/dt > 0$) are not shaded, while those appearing during a negative change of the phase-shift ($d\phi/dt < 0$) are shaded. Denoting the voltages at the positive potential outputs 2 of the phase converter units 1 by A, B, C and D, the voltages at the respective inverted potential outputs 3 of the phase converter units 1 by $\bar{A}$, $\bar{B}$, $\bar{C}$ and $\bar{D}$, the pulse voltages at the outputs 4 of the phase converter units 1 generated by the shapers 18 using positive voltage variations at the output 2 by a, b, c and d, and the pulse voltages at the outputs 5 of the phase converter units 1 generated by the shapers 19 using positive voltage variations at the outputs 3 by $\bar{a}$, $\bar{b}$, $\bar{c}$ and $\bar{d}$, the appearance of pulses at the outputs of the eight-input AND-OR gates 20 and 21 of the pulse distributor 11 (denoted, respectively by x and y) may be described by the following logical formulas:

$$x = Ac + \bar{A}\bar{c} + C\bar{a} + \bar{C}a + Bd + \bar{B}\bar{d} + D\bar{b} + \bar{D}b,$$

$$y = A\bar{c} + \bar{A}c + Ca + \bar{C}\bar{a} + B\bar{d} + \bar{B}d + Db + \bar{D}\bar{b}.$$

If the phase-metering device employs the reversible counter with negative numbers represented in two's complement form, say the binary reversible counter, the pulses from the outputs 12 and 13 (FIG. 1) of the pulse distributor may be applied directly to the inputs of the reversible counter 14. In the reversible counter 14 of the above type the sign order (or sign flip-flop) is represented by a higher-order digit counter wherein 0 denotes a positive digit and 1 a negative digit. If at a certain initial moment the reversible counter 14 is reset and a positive phase variation begins, the pulses coming to its input from the output 12 of the pulse deistributor 11 will change the lower-order digits, thus increasing the indication of the counter 14, while the zero initial state of the higher-order digits denotes that the number is positive. If the phase-shift begins to decrease, the pulses will arrive at the second input of the reversible counter 14 from the output 13 of the pulse distributor 11, thereby decreasing the indication of the counter 14. The counter 14 will slowly be reset whereby all its digits, including the higher-order (sign) digit will simultaneously change their states. The digit will be $-1$ in the case of two's complement form. The pulses coming further to the second input of the reversible counter 14 will increase the negative digit stored therein.

Such representation of the digits is not always convenient, particularly if a phase variation is displayed on a digital display panel for immediate observation. In this case use is made of a decimal reversible counter negative numbers are conventionally represented in sign-and-magnitude form, and a special sign flip-flop indicates the number sign. The direction of counting will be dependent both on the direction of phase variation and on the sign of the number stored in the counter.

For example, if the sign is positive, the indication of the counter will increase with increasing phase and decrease with decreasing phase. The opposite will occur if the sign is negative: the indication of the counter will decrease with increasing phase and increase with decreasing phase.

To permit utilization of the reversible counter with negative numbers represented in sign-and-magnitude form, the phase-metering device preferably includes a sign recorder 22 (FIG. 5) inserted between the pulse distributor 11 and the reversible counter 14.

In compliance with the invention the sign recorder 22 includes a sign flip-flop 23, four AND gates 24, 25, 26, 27, two NAND gates 28, 29, and two two-input AND-OR gates 30, 31. The first inputs of the AND gates 24, 25, 26, 27 are connected to the outputs 12 ans 13 of the pulse distributor, the outputs of the first two AND gates 24, 25 being coupled to the inputs of the sign flip-flop 23 whose outputs are connected to the first inputs of the NAND gates 28, 29 and to the inputs of the two-input AND-OR gates 30 and 31 which are connected in pairs. The outputs of the NAND gates 28 and 29 are connected to the second inputs of the AND gates 26 and 27 whose outputs are coupled to the inputs of the two-input AND-OR gates 30 and 31 which are connected in pairs.

The outputs of two-input AND-OR gates 30 and 31 are connected to the inputs of the reversible counter 14, while the second inputs of the NAND gates 28, 29 and the AND gates 24, 25 are coupled to the output of a null indicator 32 comprised in the reversible counter 14.

A peculiar operating feature of the phase-metering device provided with the sign recorder 22 is that, with varying sign of the phase-shift when the reversible counter 14 is finally transferred from the subtract mode to the zero state to be transferred further to add mode, the first pulse appearing after the resetting of the reversible conter 14 will not be stored in the reversible counter 14 being used solely to change the state of the sign flip-flop 23 as required. For example, if the zero state of the reversible counter 14 corresponds to a phase shift within the section EG (FIG. 4) with zero at the point F on the sawtooth curve K, variations near zero within the section EG will not set the reversible counter, while the sign flip-flop changes its state.

The first count pulse coming to the reversible counter 14 is a pulse corresponding to a zero transition of the curve L at the point G or of the curve Q at the point E, depending on the direction of variation of the phase shift, the state of the sign flip-flop 23 being unaffected by said pulse. Thus, the count pulses come to the reversible counter 14 (FIG. 5) symmetrically relative to a zero phase shift indicating the occurrence of the phase shift by $\pi/N$ radians, which is an advantage over the prior art. Apparently, the sign of the phase shift has been determined by the given moment. As a result, the spacing between two pulses coming to different inputs of the reversible counter 14 at the reversal moment is increased double-fold although the count-down speed is not decreased. Also, the reversal speed is increased.

Figure 5:
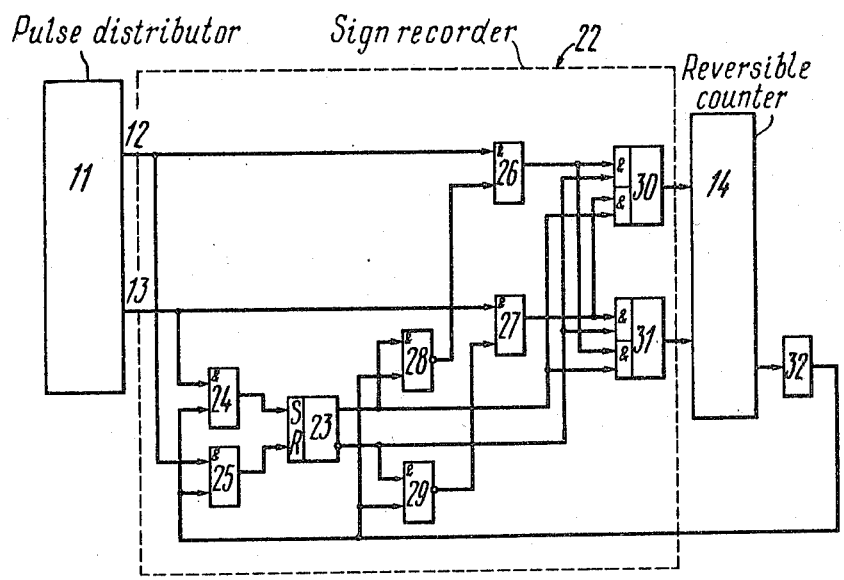
FIG. 5 is a circuit diagram of a sign recorder illustrating its connection with other assemblies of the phase-metering device according to the invention.

Consider now in more detail operation of the phase-metering device provided with the sign recorder 22 (FIG. 5).

Note that the reversible counter 14 and the sign flip-flop 23 comprised in the phase-metering device should change their states with trailing edges of the pulses coming to their inputs. If not so, minor changes are required in the sign recorder 22. Note also that the sign flip-flop 23 may be reset or set by feeding a pulse, respectively, to the R or S input thereof.

Figure 6:
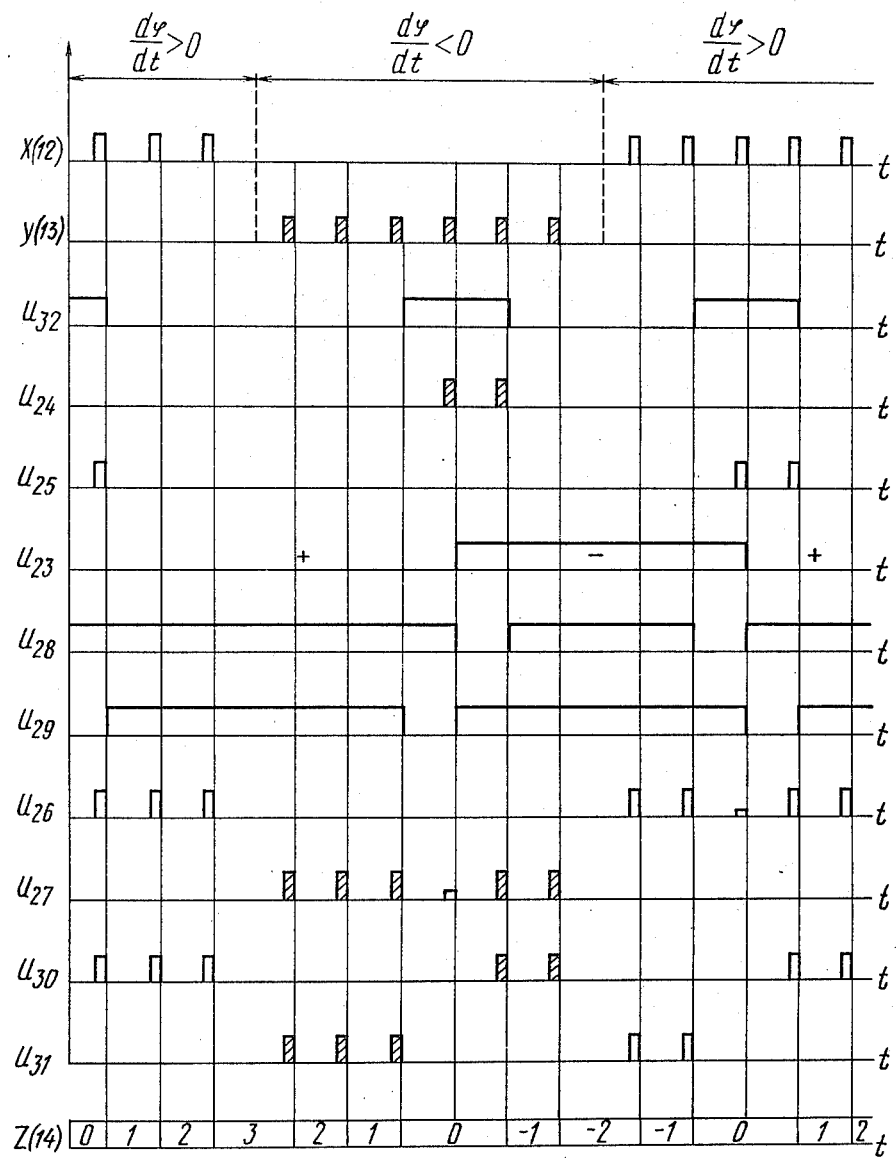
FIG. 6 gives output voltage waveforms of the circuit components of FIG. 5 and indications of the reversible counter as a function of time according to the invention.

Turning now to FIG. 6 x and y denote the voltages at the outputs 12 and 13 of the pulse distributor 11, respectively, $U_{23}$, $U_{24}$, $U_{25}$, $U_{26}$, $U_{27}$, $U_{28}$, $U_{29}$, $U_{30}$, $U_{31}$ and $U_{32}$ are the output voltages of the respective components of FIG. 5, while Z illustrates the state of the reversible counter 14.

Assume that at a certain initial moment the reversible counter 14 (FIG. 5) and the sign flip-flop 23 are reset (FIGS. 5 and 6). A high output potential of the null indicator 32 is applied to the second inputs of the AND gates 24, 25 and the NAND gates 28, 29. At this time a high potential is present at the output of the NAND gate 28 and a low potential at the output of the NAND gate 29. Accordingly, the count pulses coming from the outputs 12 ans 13 of the pulse distributor 11 are cleared to pass the AND gate 26 and prevented from passing through the AND gate 27. If the phase shift between the input signals of the phase-metering device increases ($d\phi/dt > 0$), the count pulses will be present at the output 12 of the pulse distributor (voltage x). The first count passes through the AND gate 26 and the two-input AND-OR gate 30 to the add input of the reversible counter 14 causing it to set (Z, FIG. 6). The same pulse is fed through the AND gate 25 to the R input of the sign flip-flop 23 without changing its state since it has been already reset. Since the reversible counter 14 is set, a low potential ($U_{32}$) appears at the output of the null indicator 32 inhibiting passage of the count pulses to the inputs of the sign flip-flop 23 and causing appearance of a high potential ($U_{28}$, $U_{29}$) at the outputs of both NAND gates 28, 29 whereby the count pulses will be cleared to pass through the AND gates 26 and 27. The subsequent count pulses passing through the AND gate 26 and the two-input AND-OR gate 30 will set the reversible counter 14 to 2 and then to 3 (Z, FIG. 6).

Assume that the phase shift between the input signals begins to decrease ($d\phi/dt<0$). Then the count pulses appearing at the output 13 (y, FIG. 6) of the pulse distributor 11 will be fed through the AND gate 27 and two-input AND-OR gate 31 to the subtract input of the reversible counter 14, thereby decreasing its indication.

The reversible counter 14 will again be successively set to 2, 1 and 0 (Z, FIG. 6). At this time a high potential ($U_{32}$, FIG. 6) appears at the output of the null indicator 32, thus enabling the pulses to come to the inputs of the sign flip-flop 23 and preventing appearance of a low potential at the output of the NAND gate 29 ($U_{29}$, FIG. 5) whereby the count pulses will not pass through the AND gate 27. The next pulse appearing at the output 13 of the pulse distributor 11 will not arrive at the input of the reversible counter 14. Instead it will pass through the AND gate 24 to the S input of the sign flip-flop 23 causing it to assume the 1 state denoted by the "−" sign ($U_{23}$, FIG. 6). As a result, a high potential ($U_{29}$, FIG. 6) again appears at the output of the NAND gate 29, thus enabling passage of the count pulses through the AND gate 27. The next count pulse appearing at the output 13 of the pulse distributor 11 will be fed through the AND gate 27 an and the two-input AND-OR gate 30 to the add input of the reversible counter 14 since the state of the sign flip-flop 23 has changed and the output pulses of the AND gate 27 may pass only through the two-input AND-NOT gate 30. The reversible counter 14 will be set (Z, FIG. 6). The same pulse is fed through the AND gate 24 to the S input of the sign flip-flop 23 without changing its state. After the reversible counter 14 is set, a low potential will again appear at the output of the null indicator ($U_{32}$, FIG. 6) whereby no pulses will be fed through the AND gates 24, 25 and the two AND gates 26, 27 will pass the count pulses. The next count pulses will also pass through the AND gate 27 and the two-input AND-OR gate 30 to the add input of the reversible counter, thus increasing its negative indications (Z, FIG. 6).

If in further operation the phase shift between the input signals increases again ($d\phi/dt>0$), the count pulses coming now from the output 12 (x, FIG. 6) of the pulse distributor 11 will pass through the AND gate 26 and the two-input AND-OR gate 31 to the subtract input of the reversible counter 14, thereby decreasing its negative indications.

After the reversible counter is reset, the first count pulse will only change the state of the sign flip-flop 23 from 1 to 0 (from "−" to "+") without being stored in the reversible counter 14. Beginning with the next count pulse the reversible counter 14 will have its indications increased.

Thus, the phase-metering device provided with the sign recorder 22 may employ a reversible conter with negative numbers represented in sign-and-magnitude form, a feature assuring a high reversal speed.

The phase-metering device forming the subject of the present invention permits phase shift measurements with resolution of $\pi/N$ radians at any $N \geq 2$. On the other hand, increasing the number N causes a corresponding increase in the recurrence rate of the count pulses coming to the input inputs of the reversible counter which, in turn, increases requirements for response of the reversible counter since inadequate response reduces operational reliability.

To enhance operational reliability of the phase-metering device having high resolution, it is of advantage that phase cycles should be counted with discreteness of $2\pi$ radians (corresponding to one period), information on the value of phase shift within $2\pi$ radians (with discreteness of $\pi/N$ radians) being obtained by decoding the states of the Schmitt triggers 17 of all the phase converter units 1, i.e. using the potential outputs 2 and 3 (FIG. 1) thereof. In compliance with the invention the phase-metering device preferably includes a code converter 33 (FIG. 7) inserted between the potential outputs of the phase converter units 1 and the lower-order digit inputs of the digital recorder 15. The pulse distributor 11 desirably includes two AND gates 34, 35 whose first inputs are connected to the pulse outputs 4, 5 of the last phase converter unit 1, while the second inputs thereof are interconnected and coupled to one of the potential outputs, say to the potential output 3 of one of the preceding phase converter units 1. The outputs of the AND gates 34 and 35 act as the outputs 12 and 13 of the pulse distributor 11 being connected to the inputs of the reversible counter 14.

For example, with four phase converter units (N=4) and a binary count and recording system, the code converter 33 (FIG. 8) includes, according to the invention, three exclusive OR gates 36, 37 and 38, The inputs of the first exclusive OR gate 36 are connected to the positive potential outputs of the second and fourth phase converter units 1, while the inuts of the second exclusive OR gate 37 are coupled to the positive potential outputs 2 of the first and third phase converter units 1, the inputs of the third exclusive OR gate 38 being connected to the outputs of the exclusive OR gates 36, 37, the positive potential output 2 of the last phase converter unit 1 and the outputs of the exclusive OR gates 36, 38 being coupled to the lower-order digit inputs of the digital recorder 15.

Figure 7:
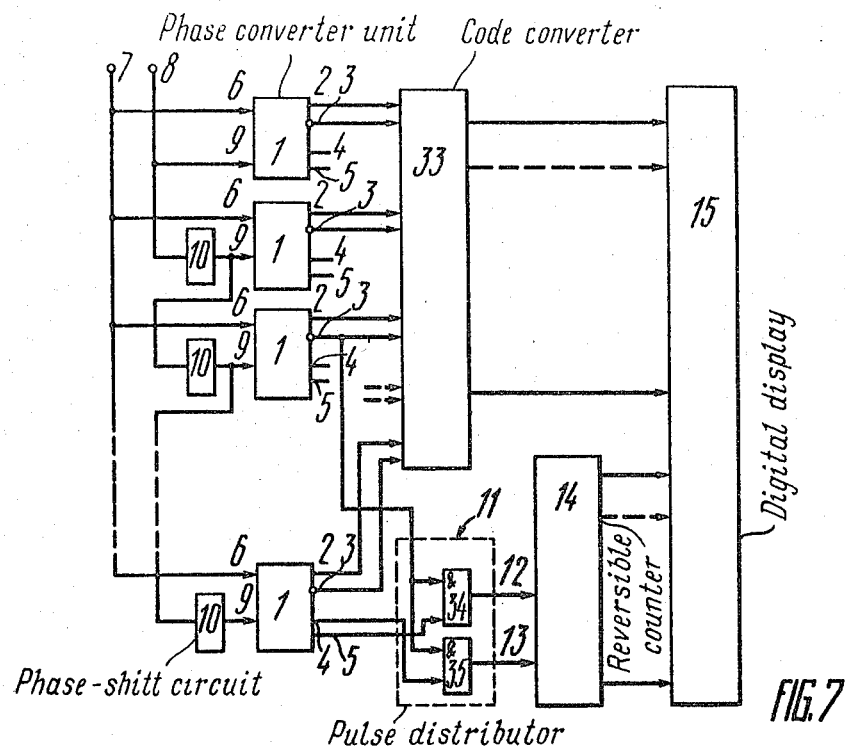
FIG. 7 is a block diagram of the phase-metering device comprising a code converter and a circuit diagram of the pulse distributor according to the invention.

In operation of the phase-metering device including the code converter 33 (FIG. 7) the count pulses arrive at the inputs of the reversible counter 14 with discreteness of $2\pi$ radians. Said pulses are generated by the shapers 18 and 19 (FIG. 2) at zero points of the output sawtooth voltages of the phase-analog converter 16 of the last phase converter unit 1 (say, at N=4, with the sawtooth voltage Q of FIG. 9). Thereafter said pulses are fed to the inputs of the AND gates 34, 35 of the pulse distributor 11 (FIG. 7). The AND gates 34 and 35 develop at their outputs only those pulses which are shaped at moments when a high enable potential is present at the potential output of one of the preceding phase converter units 1 connected to the second inputs of the AND gates 34, 35. For example, with a zero phase shift (FIG. 9) a high potential is also present at the inverted potential output of all the phase converter units 1 except for the last one (voltages $\overline{A}$, $\overline{B}$, $\overline{C}$). Since one of said outputs is connected to the second inputs of the AND gates 34, 35, the generated pulses d and d will pass to the outputs of the AND gates 34 or 35. Such coincidence will occur repeatedly every $2\pi$ radians during phase shift variations. When the phase change is positive ($d\phi/dt>0$), the count pulses (not shaded in FIG. 9) will pass through the AND gate 34 to the output 12 of the pulse distributer 11 and then to the add input of the reversible counter 14. When the phase change is negative ($d\phi/dt<0$), the count pulses (shaded in FIG. 9) will pass through the AND gate 35 to the output 13 and then to the subtract input of the reversible counter 14 (FIG. 7). The count pulses will follow with discreteness of $2\pi$ radians regardless of the resolution of the phase-metering device.

Figure 8:
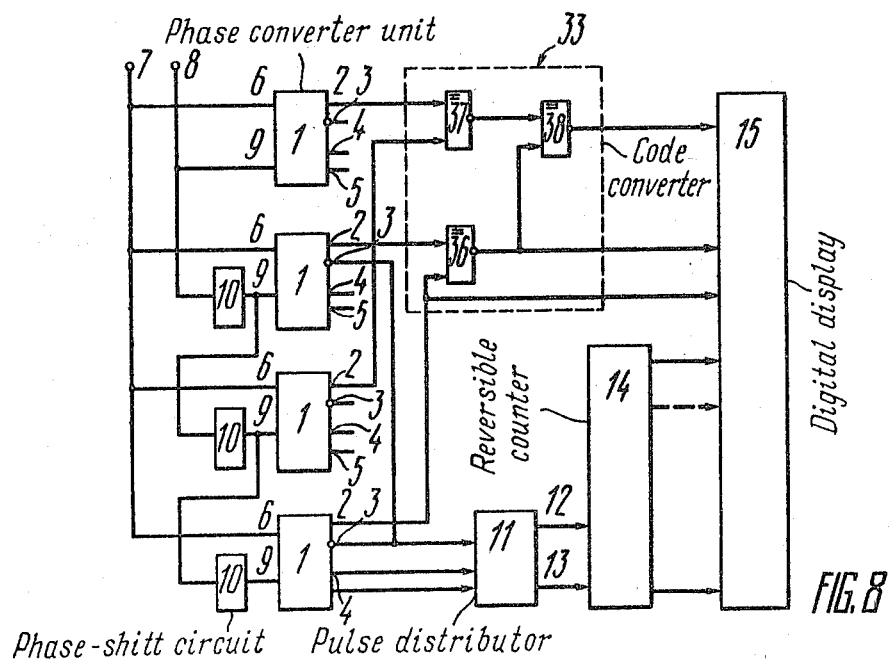
FIG. 8 is a block diagram of the phase-metering device of FIG. 7 at $N=4$ and a binary count and recording system according to the invention.
Figure 9:
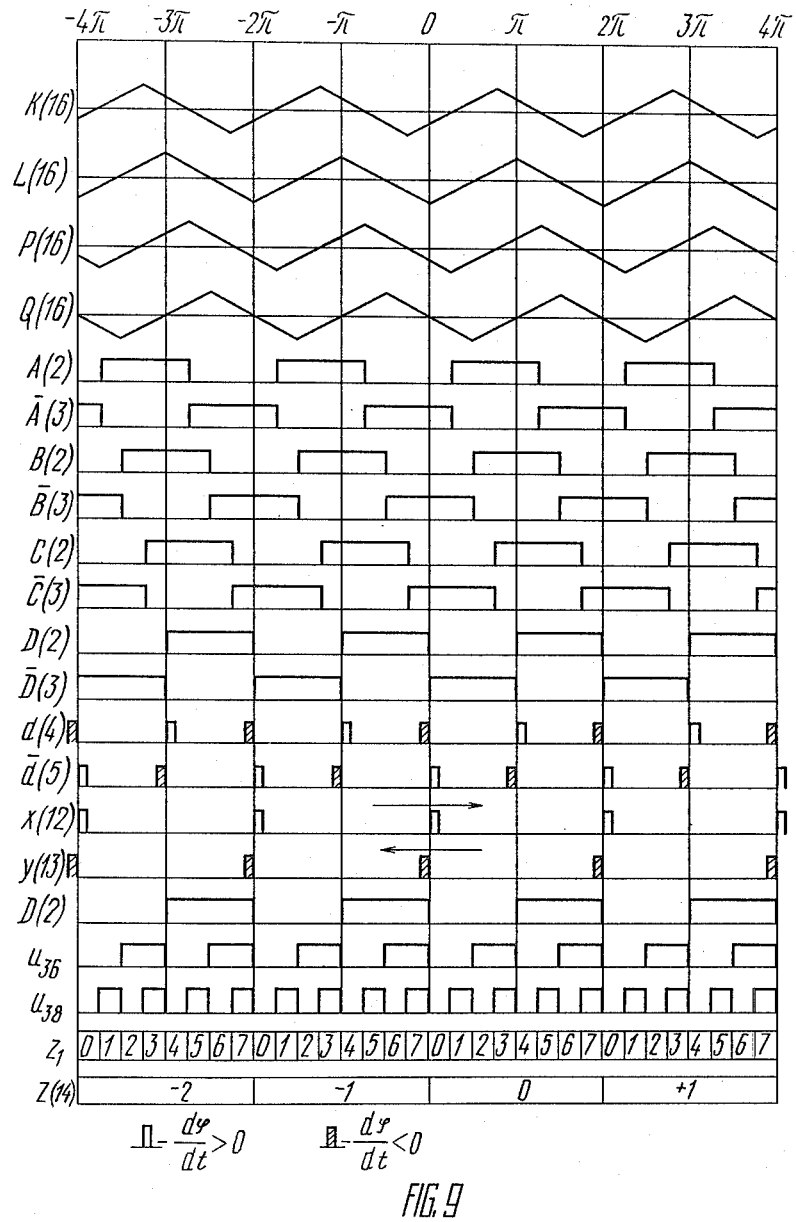
FIG. 9 gives output voltage waveforms of the circuit components of FIGS. 8 and 2 and indications of the code converter and the reversible counter as a function of phase according to the invention.

The value of phase shift within $2\pi$ radians (with discreteness of $\pi/N$ radians) may be judged by the potential outputs of the phase converter units 1. Concider another embodiment of the proposed phase-metering device at N=4 (FIGS. 8 and 9).

When the phase shift is in the range from 0 to $\pi/4$ radians, a low potential (A, B, C, D) will be present at all the positive potential outputs of the phase converter units 1 and the writtent code combination is 0000. If the phase is in the range from $\pi/4$ to $2\pi/4$ radians, the potential A is high and the code combination is 0001. The table below gives all code combinations formed under the action of the output potentials A, B, C and D as the phase varies within $2\pi$ radians.

| Phase | D | C | B | A | Binary number | Decimal number |
|---|---|---|---|---|---|---|
| $0 \ldots \pi/4$ | 0 | 0 | 0 | 0 | 000 | 0 |
| $\pi/4 \ldots 2\pi/4$ | 0 | 0 | 0 | 1 | 001 | 1 |
| $2\pi/4 \ldots 3\pi/4$ | 0 | 0 | 1 | 1 | 010 | 2 |
| $3\pi/4 \ldots \pi$ | 0 | 1 | 1 | 1 | 011 | 3 |
| $\pi \ldots 5\pi/4$ | 1 | 1 | 1 | 1 | 100 | 4 |
| $5\pi/4 \ldots 6\pi/4$ | 1 | 1 | 1 | 0 | 101 | 5 |
| $6\pi/4 \ldots 7\pi/4$ | 1 | 1 | 0 | 0 | 110 | 6 |
| $7\pi/4 \ldots 2\pi$ | 1 | 0 | 0 | 0 | 111 | 7 |

Thus, the potential outputs of the phase converter units 1 may be used to determine unambiguously a phase shift in the range of $2\pi$ with discreteness of $\pi/4$ radians ($\pi/N$ radians in the general case).

The code combinations formed at the potential outputs of the phase converter units 1 are fed to the code converter 33. With a binary count and recording system, said code combinations will be converted into a binary number. The required number of digits of a binary number may be found from the formula $$n = 1 + \log_2 N$$

When N=4 (FIG. 8) with phase discreteness of $\pi/4$ radians, a three-digit binary code will be required (n=3). The code converter 33 contains three exclusive OR gates: 36, 37 and 38. The binary digit $2^0$ is obtained from the output of the exclusive OR gate 38, the digit $2^1$ from the output of the exclusive OR gate 36, and $2^2$ digit directly from the positive potential output 3 of tha last phase converter unit 1. Referring to FIG. 9 the code combinations of output voltages (D, $U_{36}$, $U_{38}$, FIG. 9) of said gates produce three-digit binary numbers from 0 to 7 ($Z_1$, FIG. 9) as the phase varies within each $2\pi$ radians. The number formed jointly by the output voltages of the code converter 33 (lower-order digits) and the reversible counter 14 (higher-order digits) is an equivalent of the measured phase shift between the input signals with discreteness of $\pi/N$ radians. This number is recorded by the digital recorder 15.

If the obtained phase shift between the input signals is represented in sign-and-magnitude code regardless of the sign of the phase shift (say, in a decimal system) the phase-metering device of FIG. 7 may be provided with the sign recorder 22 (FIG. 10) whose circuit has been described by reference to FIG. 5. The sign recorder is inserted between the pulse distributor 11 (FIG. 10) amd the reversible counter 14 provided with the null indicator 32.

Figure 10:
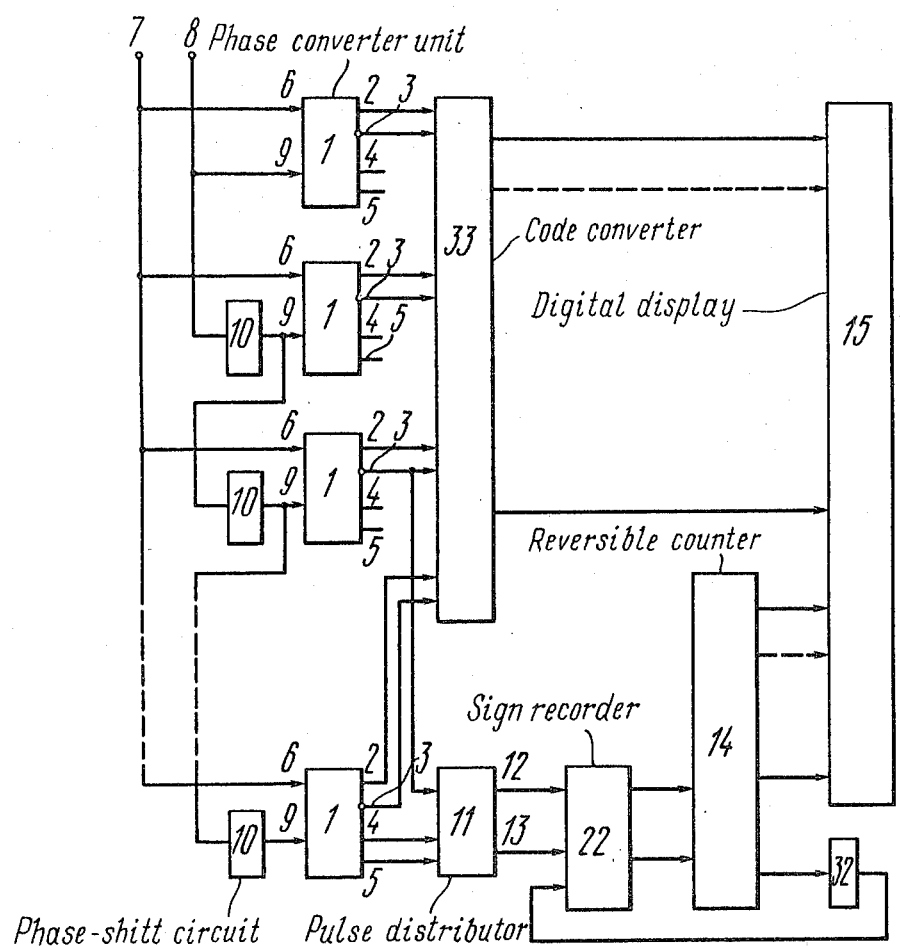
FIG. 10 is a block diagram of the phase-metering device with the code converter and the sign recorder according to the invention.

Advantages of the phase-metering device illustrated in FIGS. 7, 8 and 10 are enhanced reliability and high resolution. This has been achieved by that phase cycles are counted with discreteness equalling one period regardless of desired resolution. As a result, the recurrence rate of pulses coming to the inputs of a reversible counter is always equal to a differential (Doppler) frequency. Stated differently, it is decreased by 2N times. So, the probability of failure of the reversible counter is reduced accordingly.

Embodiments of the phase-metering device will be depending on specific requirements. If the rate of change of a phase shift between input signals is fairly low, i.e. the Doppler frequencies are not high, it is advantageous to use the phase-metering device of FIG. 1 or 5.

A specific feature of the above embodiments is that a zero indication of a digital recorder always corresponds to a zero state of the reversible counter. With fairly high Doppler frequencies and limited response of the counter, it is of advantage to employ the phase-metering device illustrated in FIGS. 7, 8 or 10.

What is claimed is:

1. A phase-metering device comprising: first and second input signal source; N−1 phase-shift circuits at N exceeding two and a phase-shift of each circuit being $\pi/N$ radians, said N−1 phase-shift circuits being electrically-connected in series, an input of the first circuit being connected to the second input signal source; N phase converter units each having positive and inverted outputs and two pulse outputs, first inputs of said units being connected to the first input signal source, a second input of the first phase converter unit being coupled to the second input signal source, while second inputs of the other phase converter units are connected to the outputs of the respective phase-shift circuits; a pulse distributor whose inputs are connected to outputs of said phase converter units; a reversible counter whose inuts are connected to the outputs of said pulse distributor; a digital recorder coupled to the outputs of said reversible counter.

2. A phase-metering device as claimed in claim 1, which is provided with a sign recorder inserted between said pulse distributor and said reversible counter having a null indicator, said sign recorder having a sign flip-flop -flop, two NAND gates, two two-input AND-OR gates and four AND gates whose first inputs are connected to the outputs of said pulse distributor, the outputs of the first two AND gates being connected to the inputs of said sign flip-flop whose outputs are connected to the first inputs of said NAND gates and to the inputs if said two-input AND-OR gates connected in pairs, the outputs of said NAND gates being coupled to the second inputs of the two AND gates whose outputs are connected to the other inputs of said two-input AND-OR gates connected in pairs, the outputs of said two-input AND-OR gates being coupled to the inputs of said reversible counter, while the second inputs of said NAND gates and the first two AND gates are coupled to the output of said null indicator.

3. A phase-metering device as claimed in claim 1, which comprises a code converter placed between said potential outputs of said phase converter units and the inputs of lower-order digit inputs of the digital recorder, while said pulse distributor includes two AND gates, whose first inputs are coupled to said pulse outputs of the last phase converter unit, second inputs thereof being interconnected and coupled to one of the potential outputs of one of the preceding phase converter units, while the outputs thereof act as the outputs of said pulse distributor.

4. A phase-metering device as claimed in claim 3, wherein at N=4 and a binary count and recording system said code converter includes three exclusive OR gates, inputs of the first gate being connected to said positive potential outputs of the second and fourth phase converter units, inputs of said second exclusive OR gate being coupled to said positive potential outputs of the first and third phase converter units, while inputs of the third exclusive OR gate is coupled to the outputs of the first two exclusive OR gates, said positive potential output of said fourth phase converter unit and the outputs of the first and third exclusive OR gates are connected to the lower-order digit inputs of the said digital recorder.

* * * * *